US012777594B2

(12) United States Patent
Chen et al.

(10) Patent No.: US 12,777,594 B2
(45) Date of Patent: Oct. 27, 2026

(54) DISPLAY MODULE, WATER COOLING HEAD DISPLAY MODULE AND ELECTRONIC DEVICE

(71) Applicants: ASUSTek COMPUTER INC., Taipei City (TW); Syncmold Enterprise Corp., New Taipei City (TW)

(72) Inventors: Chang-Hung Chen, Taipei City (TW); Chih-Kuang Lin, Taipei City (TW); Sheng-Yen Tseng, Taipei City (TW); Hsiang-Hao Chang, Taipei City (TW)

(73) Assignees: ASUSTeK COMPUTER INC., Taipei City (TW); Syncmold Enterprise Corp., New Taipei City (TW)

( * ) Notice: Subject to any disclaimer, the term of this patent is extended or adjusted under 35 U.S.C. 154(b) by 320 days.

(21) Appl. No.: 18/759,990

(22) Filed: Jun. 30, 2024

(65) Prior Publication Data

US 2025/0374448 A1 Dec. 4, 2025

(30) Foreign Application Priority Data

May 30, 2024 (TW) ................................ 113120032

(51) Int. Cl.
*H05K 5/02* (2006.01)
*H05K 7/20* (2006.01)

(52) U.S. Cl.
CPC ....... *H05K 5/0217* (2013.01); *H05K 7/20981* (2013.01)

(58) Field of Classification Search
None
See application file for complete search history.

(56) References Cited

U.S. PATENT DOCUMENTS 9,874,906 B1 * 1/2018 Hsu ....................... G06F 1/1681
10,674,629 B1 * 6/2020 Chen .................. H05K 7/20772
2002/0071246 A1 * 6/2002 Stewart ................. G06F 1/1616 361/679.04
2006/0262505 A1 * 11/2006 Cheng ................. F28D 15/0266 361/688

(Continued)

FOREIGN PATENT DOCUMENTS

CN 206523830 U * 9/2017
CN 214901821 U * 11/2021 ............... G06F 1/20

(Continued)

*Primary Examiner* — Krystal Robinson
(74) *Attorney, Agent, or Firm* — JCIPRNET

(57) ABSTRACT

A display module adapted to be disposed on a water cooling head includes a frame having opposite top and bottom portions and at least one side surface connected to the top and bottom portions respectively and having a guiding structure, a linking member, and a flexible display panel. The bottom portion is adapted to be disposed on the water cooling head. One end of the linking member is movably connected to the guiding structure, and adapted to be guided by the guiding structure to move between a deployed position and a retracted position. The flexible display panel is located on the top portion and connected to another end of the linking member. When the linking member is in the deployed position, the flexible display panel is in a non-bending state, and when the linking member is in the retracted position, the flexible display panel is in a bending state.

21 Claims, 9 Drawing Sheets

(56) References Cited

U.S. PATENT DOCUMENTS

| | | | | |
|---|---|---|---|---|
| 2007/0029069 | A1* | 2/2007 | Duan | G06F 1/20<br>257/E23.098 |
| 2011/0077557 | A1* | 3/2011 | Wing | A61B 8/546<br>601/2 |
| 2013/0241375 | A1* | 9/2013 | Matsumura | H05K 5/03<br>312/223.1 |
| 2018/0023594 | A1* | 1/2018 | Sheng | F04D 1/06<br>165/104.31 |
| 2018/0092244 | A1* | 3/2018 | Chiu | F28F 9/0221 |
| 2018/0281440 | A1* | 10/2018 | Horade | B41J 2/1752 |
| 2020/0196496 | A1* | 6/2020 | Shin | G06F 1/16 |
| 2020/0409429 | A1* | 12/2020 | Hsu | E05D 11/06 |
| 2022/0187873 | A1* | 6/2022 | Zhang | G06F 1/1601 |
| 2023/0236241 | A1* | 7/2023 | Cruzan | G01R 31/2834<br>324/756.02 |
| 2023/0393188 | A1* | 12/2023 | Cruzan | G01R 31/2893 |

FOREIGN PATENT DOCUMENTS

| | | | | |
|---|---|---|---|---|
| EP | 4050455 | A1 * | 8/2022 | H05K 5/03 |
| TW | 201543989 | A * | 11/2015 | G06F 1/203 |

* cited by examiner

DISPLAY MODULE, WATER COOLING HEAD DISPLAY MODULE AND ELECTRONIC DEVICE

CROSS-REFERENCE TO RELATED APPLICATION

This application claims the priority benefit of Taiwan application serial no. 113120032, filed on May 30, 2024. The entirety of the above-mentioned patent application is hereby incorporated by reference herein and made a part of this specification.

BACKGROUND

Technical Field

The disclosure relates to a display module and an electronic device, and particularly relates to a display module adapted for a water cooling head and an electronic device including the display module.

Description of Related Art

As the performance of personal computers continues to improve, the demand for heat dissipation has also increased accordingly. Therefore, more and more consumers are disposing water cooling heads inside the computer to dissipate heat from heating elements such as central processing units. In order to enable the water cooling head to have both aesthetic and entertainment effects, some water cooling head products are equipped with a display screen for users to display various images. However, for the display screen of the current water cooling head products, the screen size thereof cannot be changed, and it is difficult to display 3D stereoscopic effect images, thus failing to provide users with a rich user experience.

SUMMARY

The disclosure provides a display module that can provide users with a rich user experience.

The disclosure provides an electronic device whose display module can provide users with a rich user experience.

A display module of the disclosure adapted to be disposed on a water cooling head includes a frame, a linking member, and a flexible display panel. The frame has a top portion and a bottom portion that are opposite and at least one side surface. The at least one side surface is connected to the top portion and the bottom portion respectively, and the at least one side surface has a guiding structure. The bottom portion is adapted to be disposed on the water cooling head. One end of the linking member is movably connected to the guiding structure, and adapted to be guided by the guiding structure to move between a deployed position and a retracted position. The flexible display panel is located on the top portion and connected to another end of the linking member. When the linking member is in the deployed position, the flexible display panel is in a non-bending state, and when the linking member is in the retracted position, the flexible display panel is in a bending state.

An electronic device of the disclosure includes a heating element, a water cooling head, and a display module. The water cooling head is disposed above the heating element. The display module includes a frame, a linking member, and a flexible display panel. The frame has a top portion and a bottom portion that are opposite and at least one side surface. The at least one side surface is connected to the top portion and the bottom portion respectively, and the at least one side surface has a guiding structure. The bottom portion is disposed on the water cooling head. One end of the linking member is movably connected to the guiding structure, and adapted to be guided by the guiding structure to move between a deployed position and a retracted position. The flexible display panel is located on the top portion and connected to another end of the linking member. When the linking member is in the deployed position, the flexible display panel is in a non-bending state, and when the linking member is in the retracted position, the flexible display panel is in a bending state.

A water cooling head display module of the disclosure includes a casing, a water cooling head, and a display module. The casing has an accommodating space. The accommodating space defines an upper space and a lower space. The upper space has a top portion and at least one side surface connected to the top portion, and the at least one side surface has a guiding structure. The water cooling head is located in the lower space. The display module is located in the upper space and includes a linking member and a flexible display panel. One end of the linking member is movably connected to the guiding structure, and adapted to be guided by the guiding structure to move between a deployed position and a retracted position. The flexible display panel is located on the top portion and connected to another end of the linking member. When the linking member is in the deployed position, the flexible display panel is in a non-bending state, and when the linking member is in the retracted position, the flexible display panel is in a bending state.

Based on the above, in the display module of the disclosure, the frame configured to carry the flexible display panel can use its guiding structure to guide the movement of the linking member, so that the flexible display panel transitions to the non-bending state or the bending state. The flexible display panel in the non-bending state can provide a larger display area, and the flexible display panel in the bending state can display 3D animations through its curved surface. Accordingly, the display module of the disclosure can provide users with a rich user experience.

DESCRIPTION OF THE EMBODIMENTS

Figure 1:
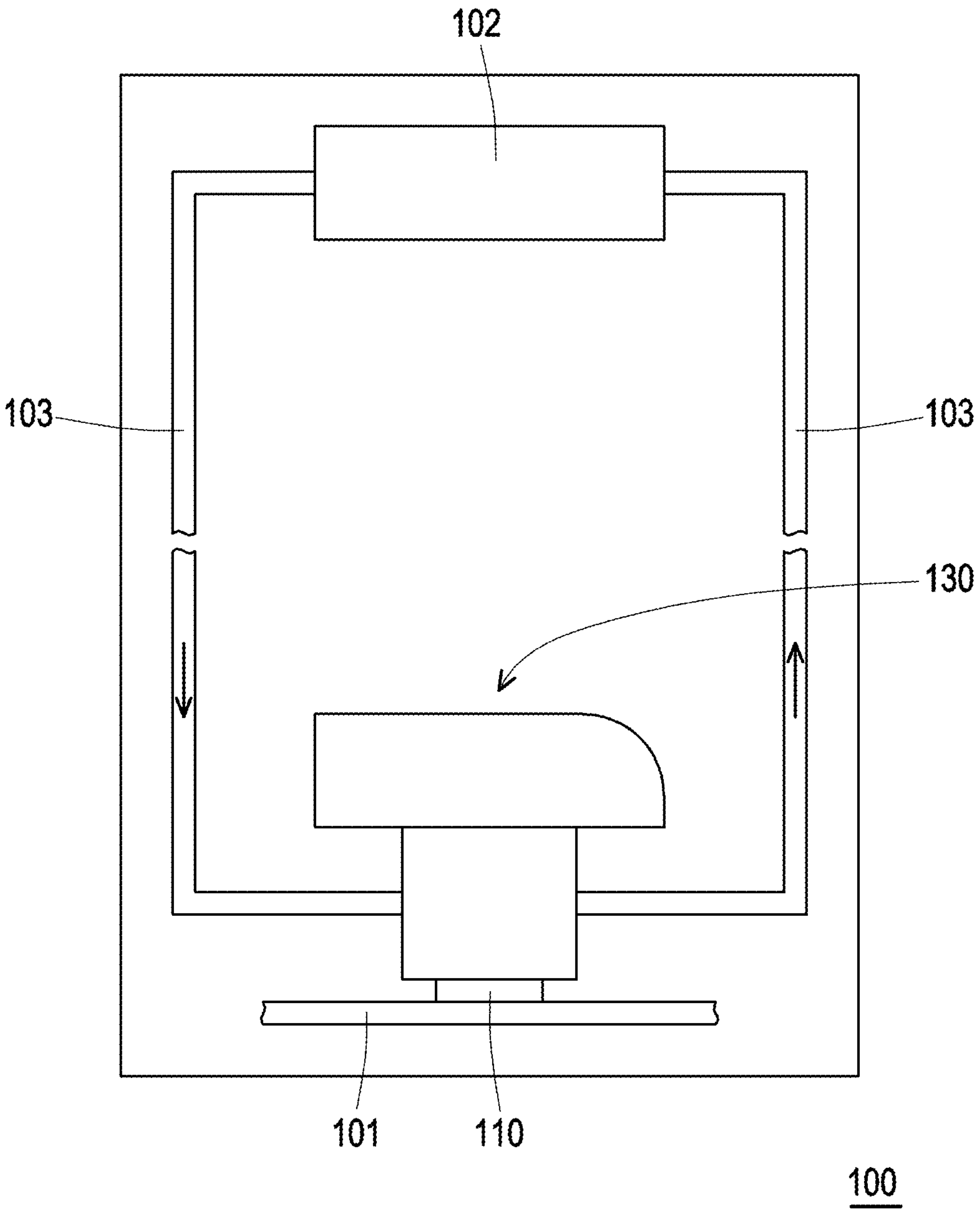
FIG. 1 is a schematic view of an electronic device according to an embodiment of the disclosure.

FIG. 1 is a schematic view of an electronic device according to an embodiment of the disclosure. Referring to FIG. 1, an electronic device 100 of the embodiment includes a heating element 110 and a water cooling head 120. The heating element 110 is, for example, a central processing unit or other types of heating elements and is, for example, disposed on a circuit board 101 of the electronic device 100. The water cooling head 120 is disposed above the heating element 110 and connected to a heat dissipation unit 102 via a pipeline 103. The heat dissipation unit 102 may include a heat dissipation fan and/or a heat dissipation fin set, but the disclosure is not limited thereto.

After the water cooling liquid in the water cooling head 120 absorbs the heat from the heating element 110 and heats up, it reaches the heat dissipation unit 102 via the pipeline 103 for heat dissipation, and then returns to the water cooling head 120 via the pipeline 103, thereby continuously cooling the heating element 110 in a continuous cycle. The detailed arrangement and principle of the water cooling head 120 for cooling the heating element 110 are known technologies in the art and therefore a detailed description will be omitted.

Figure 2:
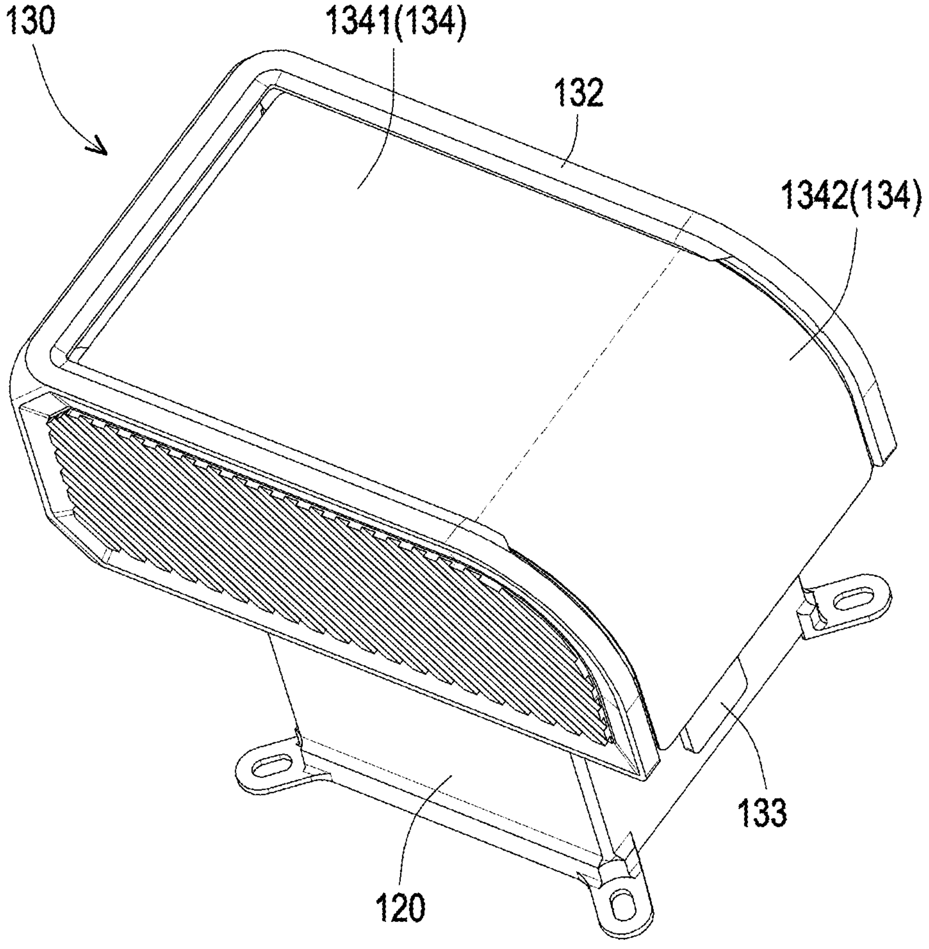
FIG. 2 is a three-dimensional view of the water cooling head and display module of FIG. 1.
Figure 3:
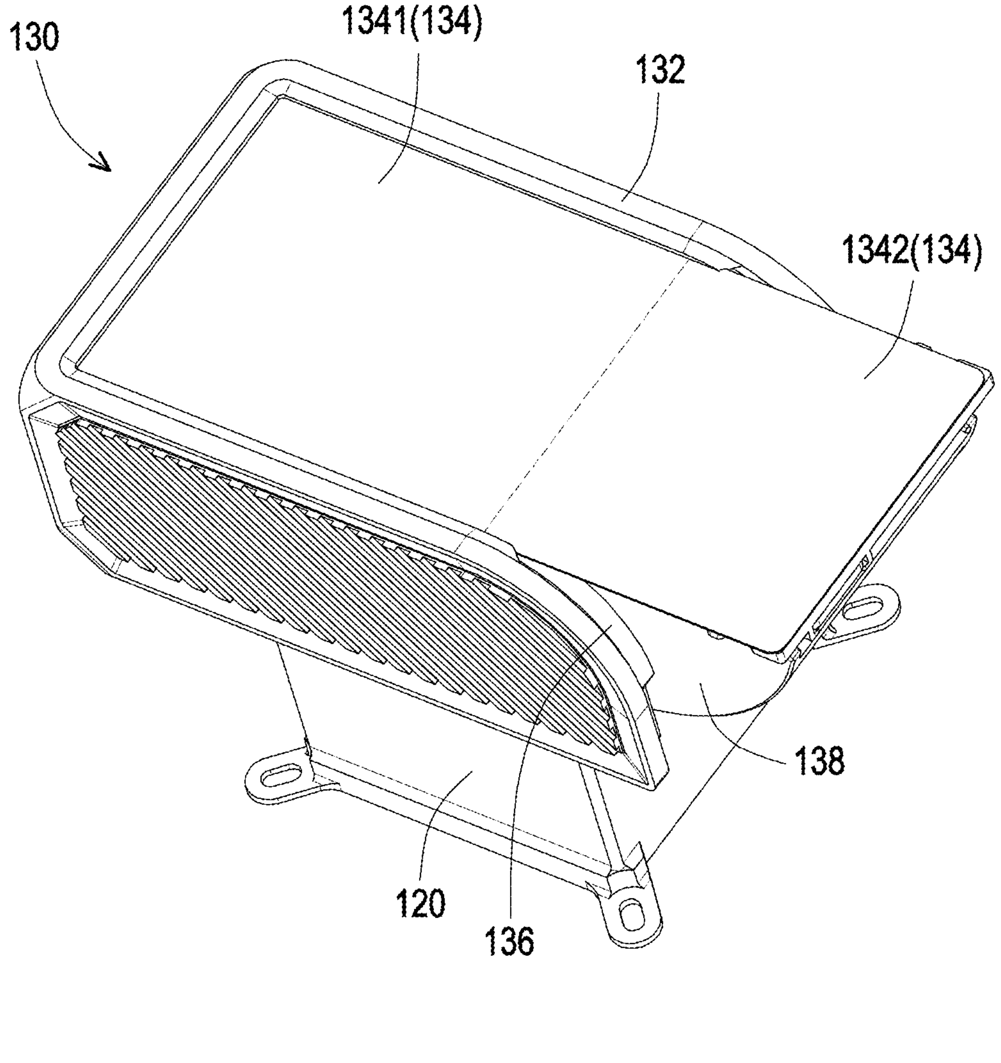
FIG. 3 illustrates an operation of the display module of FIG. 2.

FIG. 2 is a three-dimensional view of the water cooling head and display module of FIG. 1. FIG. 3 illustrates an operation of the display module of FIG. 2. Referring to FIG. 1 to FIG. 3, the electronic device 100 of the embodiment further includes a display module 130. The display module 130 is disposed on the water cooling head 120 for displaying various information. In the embodiment, the display module 130 includes a flexible display panel 134, and the flexible display panel 134 can transition between a bending state shown in FIG. 2 and a non-bending state shown in FIG. 3.

Figure 4:
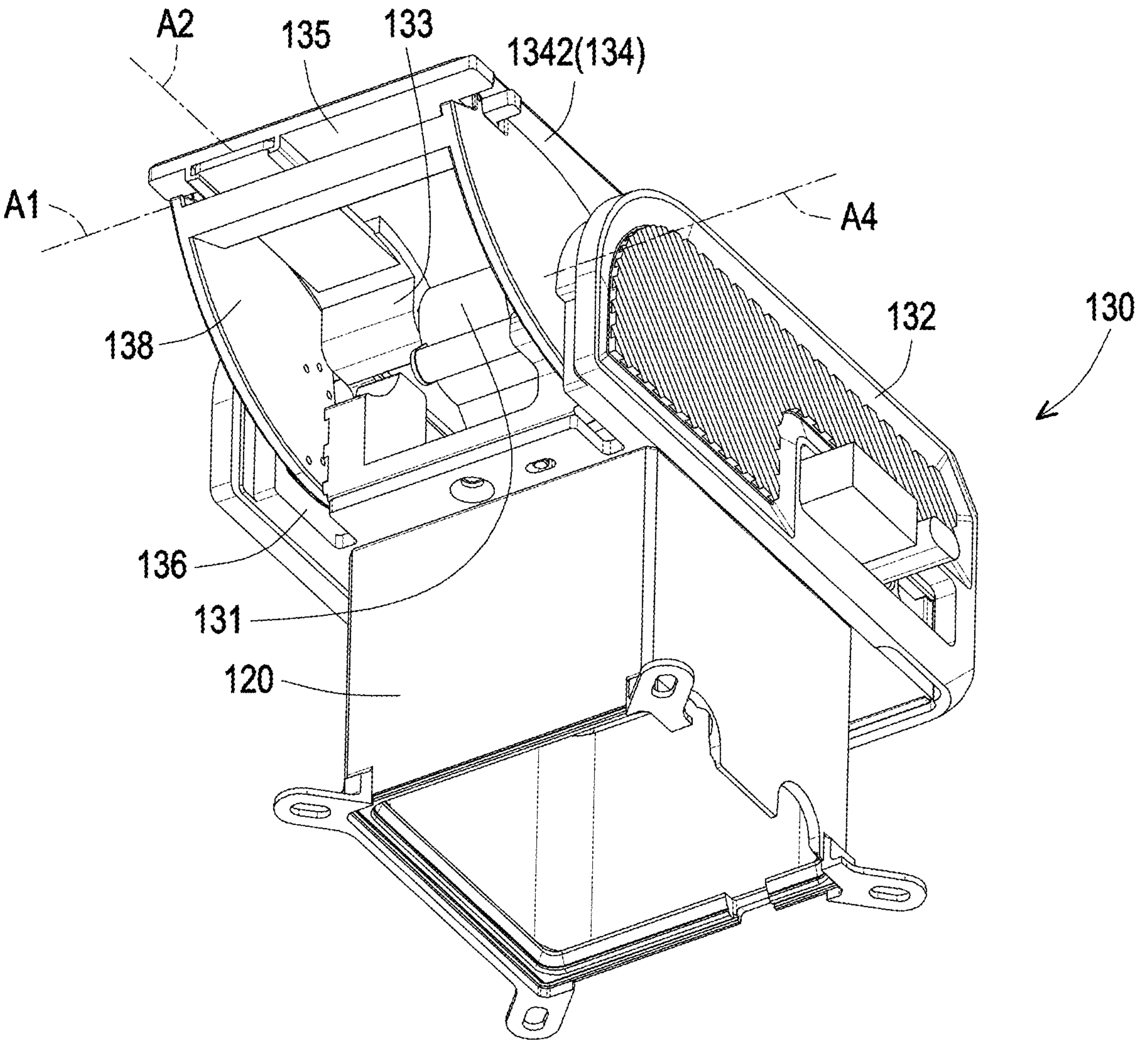
FIG. 4 is a three-dimensional view of the water cooling head and display module of FIG. 3 from another perspective.
Figure 5:
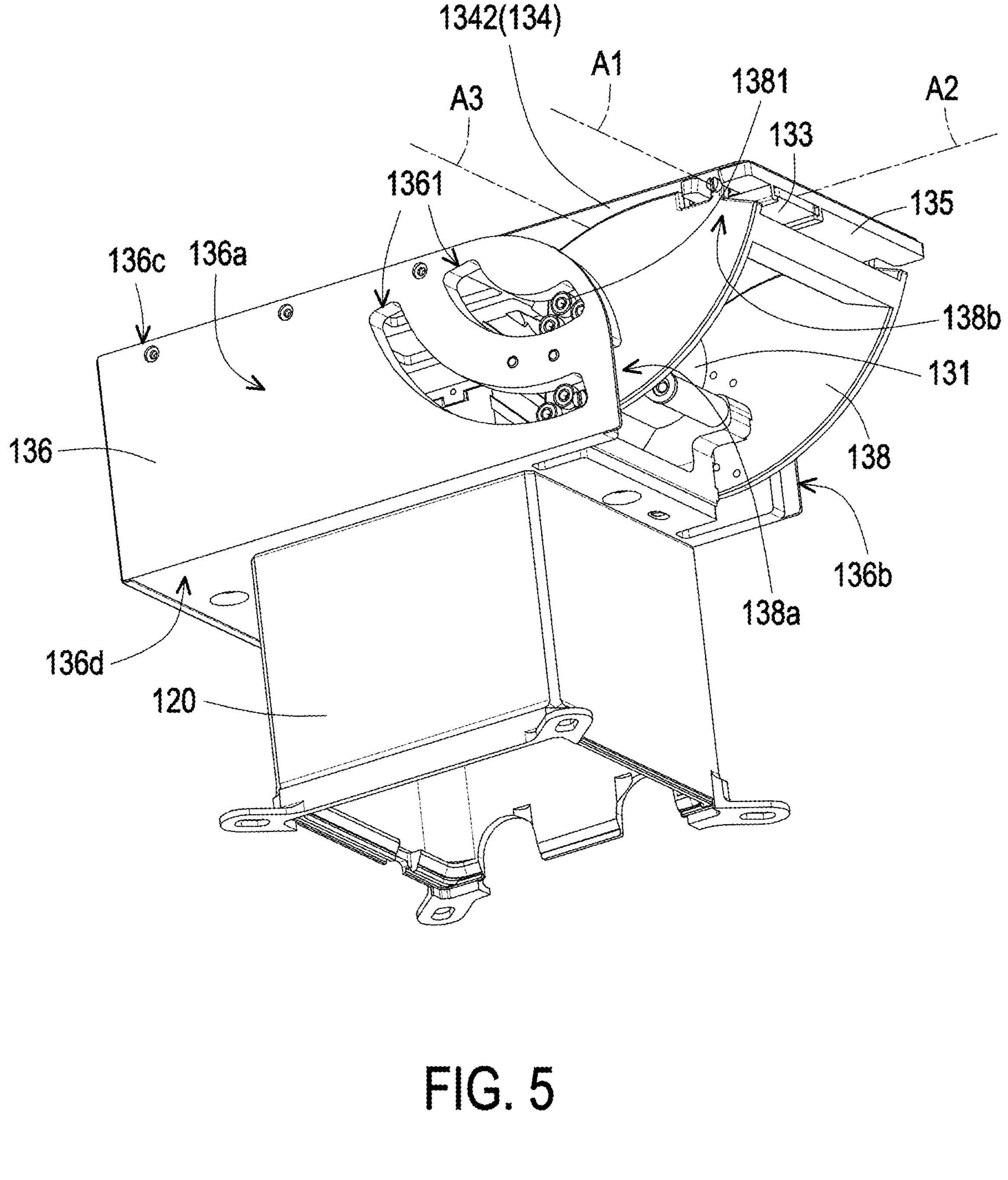
FIG. 5 is a three-dimensional view of a part of components of the water cooling head and display module of FIG. 4.
Figure 6:
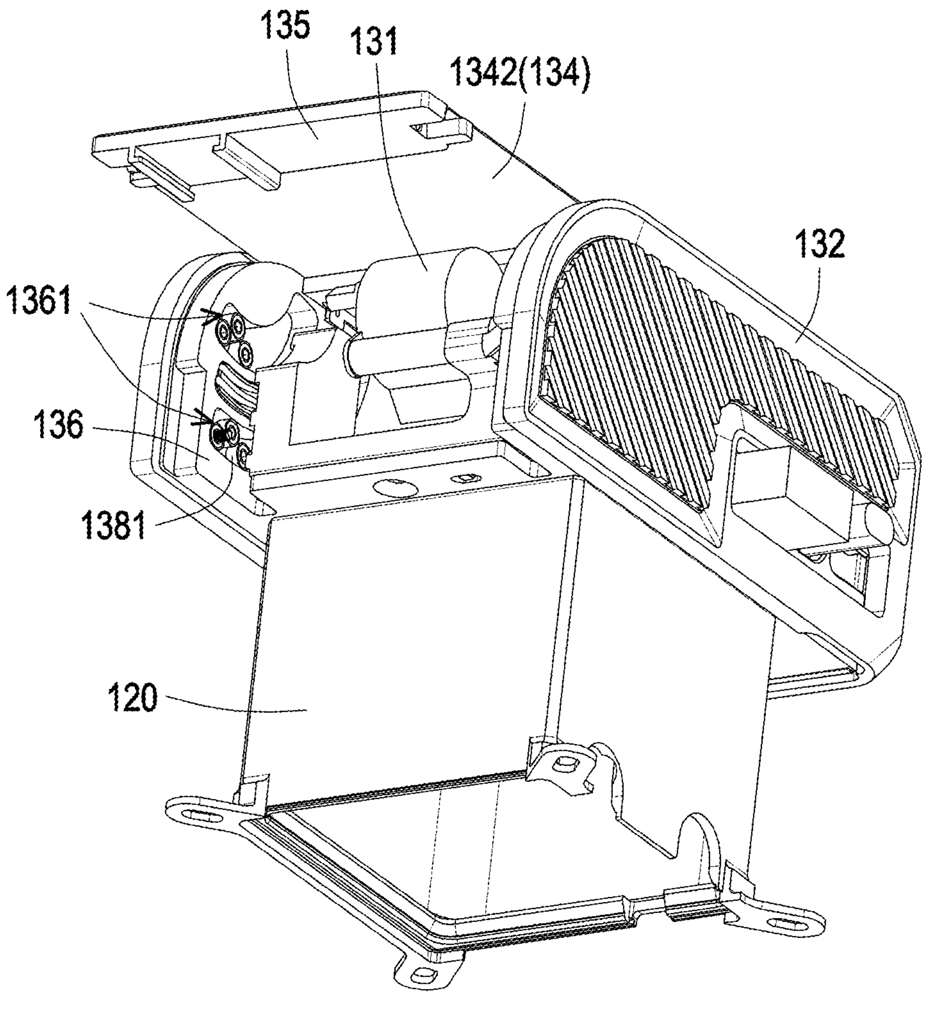
FIG. 6 is a three-dimensional view of a part of components of the water cooling head and display module of FIG. 4.

FIG. 4 is a three-dimensional view of the water cooling head and display module of FIG. 3 from another perspective. FIG. 5 is a three-dimensional view of a part of components of the water cooling head and display module of FIG. 4. FIG. 6 is a three-dimensional view of a part of components of the water cooling head and display module of FIG. 4. Referring to FIG. 4 to FIG. 6, specifically, the display module 130 of the embodiment further includes an outer casing 132, a frame 136, and a linking member 138. The frame 136 has a top portion 136*c* and a bottom portion 136*d* that are opposite and at least one side surface connected to the top portion 136*c* and the bottom portion 136*d* respectively (FIG. 5 indicates two side surfaces 136*a* and 136*b* that are opposite). The side surfaces 136*a* and 136*b* have a guiding structure (shown as a plurality of arc-shaped guiding grooves 1361). The bottom portion 136*d* is disposed on the water cooling head 120, for example, by locking or magnetic attraction, but the disclosure is not limited thereto. The outer casing 132 covers the frame 136 to become an appearance component. One end 138*a* (indicated in FIG. 5) of the linking member 138 is movably connected to the arc-shaped guiding grooves 1361 through its bearing 1381. The flexible display panel 134 is located on the top portion 136*c* and connected to another end 138*b* of the linking member 138 (indicated in FIG. 5).

Figure 7A:
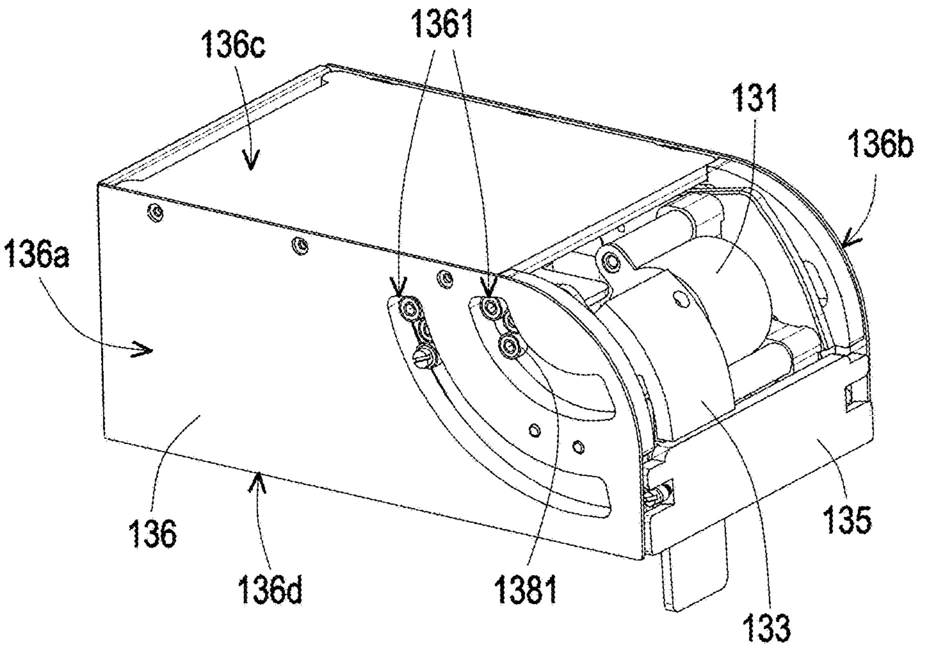
FIG. 7A to FIG. 7C illustrate an operation flow of a part of components of the display module of FIG. 2.
Figure 7B:
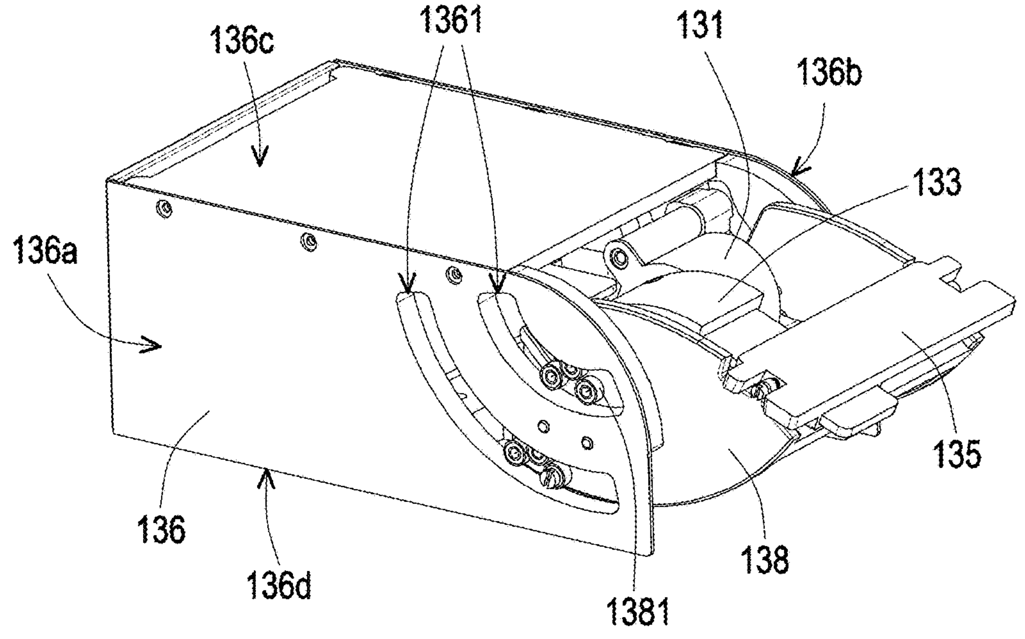
Figure 7C:
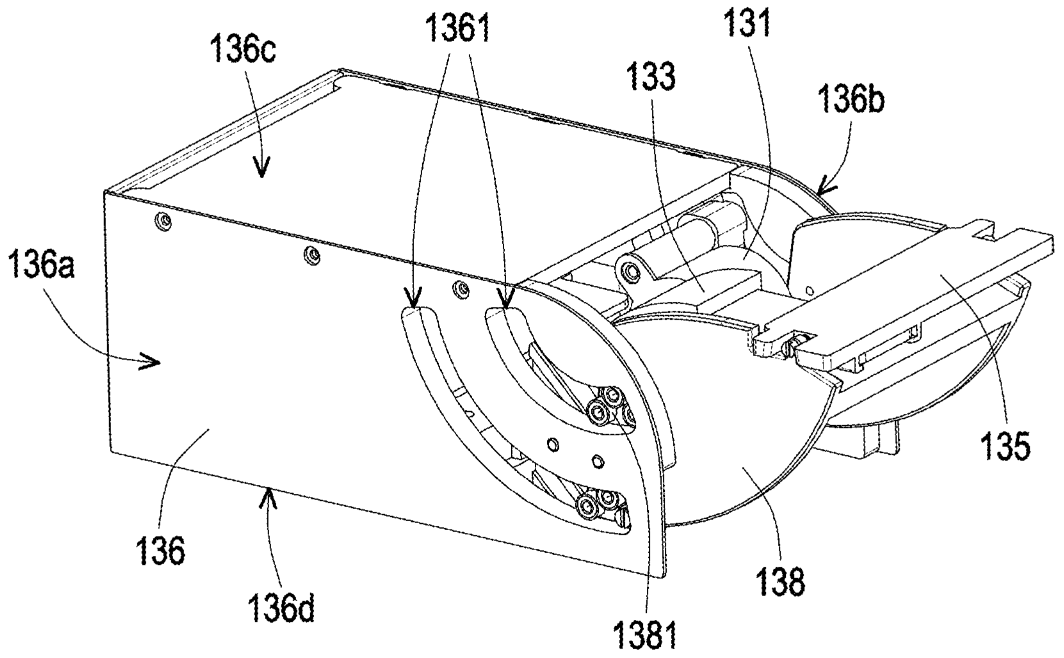

FIG. 7A to FIG. 7C illustrate an operation flow of a part of components of the display module of FIG. 2. The linking member 138 is adapted to be guided by the arc-shaped guiding grooves 1361 of the frame 136 to move along an arc-shaped path between a retracted position shown in FIG. 7A and a deployed position shown in FIG. 7C. During the above-mentioned movement of the linking member 138, the linking member 138 rotates around a rotation axis A3 (shown in FIG. 5), and the rotation axis A3 corresponds to a center of curvature of the arc-shaped guiding groove 1361. When the linking member 138 is located in the retracted position shown in FIG. 7A, the flexible display panel 134 is in the bending state shown in FIG. 2, and when the linking member 138 is located in the deployed position shown in FIG. 7C, the flexible display panel 134 is in the non-bending state shown in FIG. 3.

As mentioned above, in the display module 130 of the embodiment, the frame 136 configured to carry the flexible display panel 134 can guide the movement of the linking member 138 through its guiding structures (arc-shaped guiding grooves 1361), so that the flexible display panel 134 transitions to the non-bending state or the bending state. The flexible display panel 134 in the non-bending state can provide a larger display area, and the flexible display panel 134 in the bending state can display 3D animations through its curved surface. Accordingly, the display module 130 of the embodiment can provide the user with a rich user experience.

In the embodiment, the frame 136 has guiding structures (arc-shaped guiding grooves 1361) on two side surfaces 136*a* and 136*b*, which are disposed symmetrically. That is, the guiding structures (arc-shaped guiding grooves 1361) on the side surface 136*a* are symmetrical to the guiding structures (arc-shaped guiding grooves 1361) on the side surface 136*b*. In addition, the disclosure does not limit the specific form of the guiding structures of the frame 136. In addition to including the plurality of arc-shaped guiding grooves 1361 as mentioned above, it may also include a smaller amount of arc-shaped guiding grooves, or there may be other forms of guiding structures adapted to guide the linking member 138 to move in the above manner.

Referring to FIG. 4, in the embodiment, the display module 130 further includes an actuator 131. The actuator 131 is, for example, a motor and is coupled to the linking member 138, and is configured to drive the linking member 138 to move in the above manner. In detail, the display module 130 of the embodiment further includes a rotating member 133 and a sliding member 135. The rotating member 133 is rotatably disposed in the frame 136 and connected to the actuator 131. The sliding member 135 is fixedly connected to the flexible display panel 134, so that the flexible display panel 134 is indirectly connected to the linking member 138 through the sliding member 135. The sliding member 135 is pivotally connected to the linking member 138 along a rotation axis A1 (shown in FIG. 4 and FIG. 5) and slidably disposed on the rotating member 133 along a sliding axis A2 (shown in FIG. 4 and FIG. 5). The actuator is configured to drive the rotating member 133 to rotate along a rotation axis A4 (shown in FIG. 4) parallel to the rotation axis A1, so that the linking member 138 pulls the sliding member 135 to operate as shown in FIG. 7A to FIG. 7C or as shown in FIG. 7C to FIG. 7A during the rotation of the rotating member 133, so as to drive the flexible display panel 134 to operate.

In detail, in the embodiment, a first section 1341 (shown in FIG. 2 and FIG. 3) of the flexible display panel 134 is fixed to the top portion 136*c* (shown in FIG. 7A to FIG. 7C) of the frame 136. An end of a second section 1342 (shown in FIG. 2 and FIG. 3) of the flexible display panel 134 is fixed to the sliding member 135. The second section 1342 of the flexible display panel 134 is a bendable portion. To make the drawings clearer, dotted lines are used to distinguish the first section 1341 and the second section 1342 in FIG. 2 and FIG. 3. The disclosure does not limit the relative sizes of the first section 1341 of the flexible display panel 134 and the second section 1342 of the flexible display panel 134. A display area of the first section 1341 may be larger than a display area of the second section 1342 as shown in FIG. 3, or may be smaller than a display area of the second section 1342, or may be as large as a display area of the second section 1342. Furthermore, in the embodiment, the rotation axis A4 of the rotating member 133 is perpendicular to the sliding axis A2 of the sliding member 135, and the rotation axis A3 of the linking member 138 is parallel to the rotation axis A4 of the rotating member 133.

In the embodiment, the user, for example, controls the actuator 131 through the software of the electronic device. That is, the user independently chooses to have the display module 130 enter the state shown in FIG. 2 or the state shown in FIG. 3 according to his or her preference. However, the disclosure is not limited thereto. In other embodiments, the electronic device 100 can automatically control the actuator 131 according to preset parameters. In addition, in other embodiments, the actuator 131 may not be used to drive the linking member 138 to move. Instead, the user may manually switch the linking member 138 between the state of FIG. 7A and the state of FIG. 7C, so that the configuration of the actuator 131 can be omitted.

Figure 8:
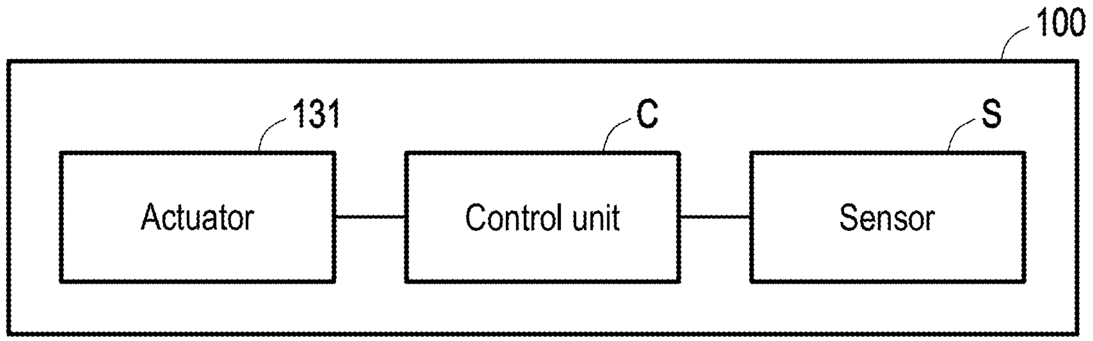
FIG. 8 is a schematic view of a part of components of the electronic device of FIG. 1.

FIG. 8 is a schematic view of a part of components of the electronic device of FIG. 1. Referring to FIG. 8, the electronic device 100 of the embodiment further includes a control unit C and a sensor S. The sensor S is configured to sense an operating state of the electronic device 100, and the control unit S is configured to control the movement of the linking member 138 (shown in FIG. 3) using the actuator 131 based on the operating state. For example, the sensor S may be a temperature sensor for sensing the temperature of the heating element 110 (shown in FIG. 1) of the electronic device. The operating state includes an overheating state of the heating element 110 of the electronic device 100. When the sensor S senses that the heating element 110 is overheated, the control unit C controls the movement of the linking member 138 using the actuator 131, so that the flexible display panel 134 becomes the bending state as shown in FIG. 2. Therefore, the bent flexible display panel 134 can display striking 3D animations as a warning of system overheating. In other embodiments, the sensor S can be other types of sensors to sense other types of operating states of the electronic device 100, so that the control unit C controls the movement of the linking member 138 accordingly, but the disclosure is not limited thereto.

Figure 9:
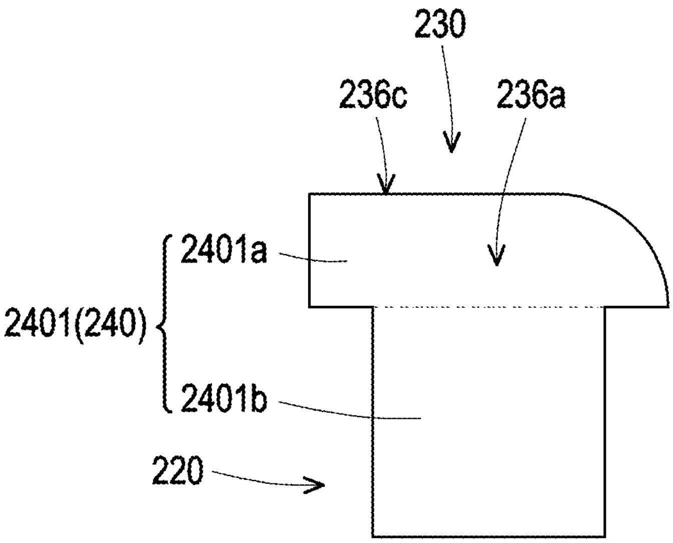
FIG. 9 is a schematic view of a water cooling head display module according to an embodiment of the disclosure.

FIG. 9 is a schematic view of a water cooling head display module according to an embodiment of the disclosure. Referring to FIG. 9, a water cooling head display module 200 of the embodiment includes a casing 240, a water cooling head 220, and a display module 230. The main difference between the embodiment shown in FIG. 9 and the embodiments shown in FIG. 1 to FIG. 8 is that, the outer casing 132 of the embodiment shown in FIG. 1 to FIG. 8 only accommodates the display module 130 and is disposed above the water cooling head 120, while the embodiment of FIG. 9 uses the single casing 240 as a common outer casing of the water cooling head 220 and the display module 230. In detail, in the embodiment of FIG. 9, the casing 240 has an accommodating space 2401. The accommodating space 2401 defines an upper space 2401*a* and a lower space 2401*b*. The upper space 2401*a* has a top portion 236*c* and at least one side surface 236*a* connected to the top portion 236*c*. The at least one side surface 236*a* has a guiding structure. The water cooling head 220 is located in the lower space 2401*b*. The display module 230 is located in the upper space 2401*a* and includes a linking member and a flexible display panel. The specific configuration and operation mode of the guiding structure, the linking member, and the flexible display panel are the same or similar to the configuration and operation mode the guiding structure, the linking member, and the flexible display panel of the embodiments shown in FIG. 1 to FIG. 8 and therefore a detailed description will be omitted.

To sum up, in the display module of the disclosure, the frame configured to carry the flexible display panel can use its guiding structure to guide the movement of the linking member, so that the flexible display panel transitions to the non-bending state or the bending state. The flexible display panel in the non-bending state can provide a larger display area, and the flexible display panel in the bending state can display 3D animations through its curved surface. Accordingly, the display module of the disclosure can provide users with a rich user experience.

What is claimed is:

1. A display module, adapted to be disposed on a water cooling head, comprising:

a frame, having a top portion and a bottom portion that are opposite and at least one side surface, wherein the at least one side surface is connected to the top portion and the bottom portion respectively, the at least one side surface has a guiding structure, and the bottom portion is adapted to be disposed on the water cooling head;

a linking member, having an end movably connected to the guiding structure, and adapted to be guided by the guiding structure to move between a deployed position and a retracted position; and a flexible display panel, located on the top portion, and connected to another end of the linking member, wherein when the linking member is in the deployed position, the flexible display panel is in a non-bending state, and when the linking member is in the retracted position, the flexible display panel is in a bending state.

2. The display module according to claim 1, wherein the guiding structure is adapted to guide the linking member to move along an arc-shaped path.

3. The display module according to claim 1, wherein the guiding structure comprises at least one arc-shaped guiding groove, and the linking member is slidably disposed in the at least one arc-shaped guiding groove.

4. The display module according to claim 3, wherein an amount of the at least one arc-shaped guiding groove is plural.

5. The display module according to claim 1, further comprising an actuator, wherein the actuator is coupled to the linking member and configured to drive the linking member to move.

6. The display module according to claim 1, further comprising a rotating member and a sliding member, wherein the rotating member is rotatably disposed in the frame, and the sliding member is connected to the flexible display panel, pivotally connected to the linking member, and slidably disposed on the rotating member.

7. The display module according to claim 6, further comprising an actuator, wherein the actuator is connected to the rotating member and configured to drive the rotating member to rotate.

8. The display module according to claim 6, wherein a rotation axis of the rotating member is perpendicular to a sliding axis of the sliding member.

9. The display module according to claim 6, wherein the guiding structure is adapted to guide the linking member to rotate around a rotation axis, and the rotation axis of the linking member is parallel to a rotation axis of the rotating member.

10. An electronic device, comprising:

a heating element;

a water cooling head, disposed above the heating element; and a display module, comprising:

a frame, having a top portion and a bottom portion that are opposite and at least one side surface, wherein the at least one side surface is connected to the top portion and the bottom portion respectively, the at least one side surface has a guiding structure, and the bottom portion is disposed on the water cooling head;

a linking member, having an end movably connected to the guiding structure, and adapted to be guided by the guiding structure to move between a deployed position and a retracted position; and a flexible display panel, located on the top portion, and connected to another end of the linking member, wherein when the linking member is in the deployed position, the flexible display panel is in a non-bending state, and when the linking member is in the retracted position, the flexible display panel is in a bending state.

11. The electronic device according to claim 10, wherein the guiding structure is adapted to guide the linking member to move along an arc-shaped path.

12. The electronic device according to claim 10, wherein the guiding structure comprises at least one arc-shaped guiding groove, and the linking member is slidably disposed in the at least one arc-shaped guiding groove.

13. The electronic device according to claim 12, wherein an amount of the at least one arc-shaped guiding groove is plural.

14. The electronic device according to claim 10, wherein the display module further comprises an actuator, the actuator is coupled to the linking member and configured to drive the linking member to move.

15. The electronic device according to claim 10, wherein the display module further comprises a rotating member and a sliding member, the rotating member is rotatably disposed in the frame, and the sliding member is connected to the flexible display panel, pivotally connected to the linking member, and slidably disposed on the rotating member.

16. The electronic device according to claim 15, wherein the display module further comprises an actuator, and the actuator is connected to the rotating member and configured to drive the rotating member to rotate.

17. The electronic device according to claim 15, wherein a rotation axis of the rotating member is perpendicular to a sliding axis of the sliding member.

18. The electronic device according to claim 15, wherein the guiding structure is adapted to guide the linking member to rotate around a rotation axis, and the rotation axis of the linking member is parallel to a rotation axis of the rotating member.

19. The electronic device according to claim 10, further comprising a control unit and a sensor, wherein the sensor is configured to sense an operating state of the electronic device, and the control unit is configured to control a movement of the linking member based on the operating state.

20. The electronic device according to claim 19, wherein the sensor is a temperature sensor, and the operating state comprises an overheating state of the electronic device.

21. A water cooling head display module, comprising:

a casing, having an accommodating space, wherein the accommodating space defines an upper space and a lower space, the upper space has a top portion and at least one side surface connected to the top portion, and the at least one side surface has a guiding structure;

a water cooling head, located in the lower space; and a display module, located in the upper space, comprising:

a linking member, having an end movably connected to the guiding structure, and adapted to be guided by the guiding structure to move between a deployed position and a retracted position; and a flexible display panel, located on the top portion, and connected to another end of the linking member, wherein when the linking member is in the deployed position, the flexible display panel is in a non-bending state, and when the linking member is in the retracted position, the flexible display panel is in a bending state.

* * * * *